United States Patent [19]

Abe et al.

[11] Patent Number: 4,573,015

[45] Date of Patent: Feb. 25, 1986

[54] METHOD OF MEASURING INTERNAL INFORMATION FROM A TARGET BY USING NUCLEAR MAGNETIC RESONANCE

[75] Inventors: Zenwemon Abe, Yokohama; Yoshifumi Yamada, Utsunomiya; Kunio Tanaka, Asahikawa, all of Japan

[73] Assignee: Asahikawa Medical College, Hokkaido, Japan

[21] Appl. No.: 525,647

[22] Filed: Aug. 23, 1983

[30] Foreign Application Priority Data

Aug. 31, 1982 [JP] Japan .............................. 57-151172
Aug. 31, 1982 [JP] Japan .............................. 57-151173

[51] Int. Cl.$^4$ ........................................ G01R 33/08
[52] U.S. Cl. .................................... 324/309; 324/313
[58] Field of Search ............... 324/300, 307, 309, 311, 324/313

[56] References Cited

U.S. PATENT DOCUMENTS 3,774,103 11/1973 Laukien .............................. 324/313
4,290,019 9/1981 Hutchison ........................... 324/309

Primary Examiner—Michael J. Tokar
Attorney, Agent, or Firm—Stevens, Davis, Miller & Mosher

[57] ABSTRACT

The disclosed method comprises steps of alternately applying a strong static magnetic field and a weak homogeneous static magnetic field to a body being measured (target), selectively exciting nuclear magnetic resonance (NMR) at a specific portion of the target by applying a high-frequency magnetic field and a specifying magnetic field thereto, detecting NMR signals from the thus excited portion, and scanning the target by repeating the selective excitation and the detection.

23 Claims, 32 Drawing Figures

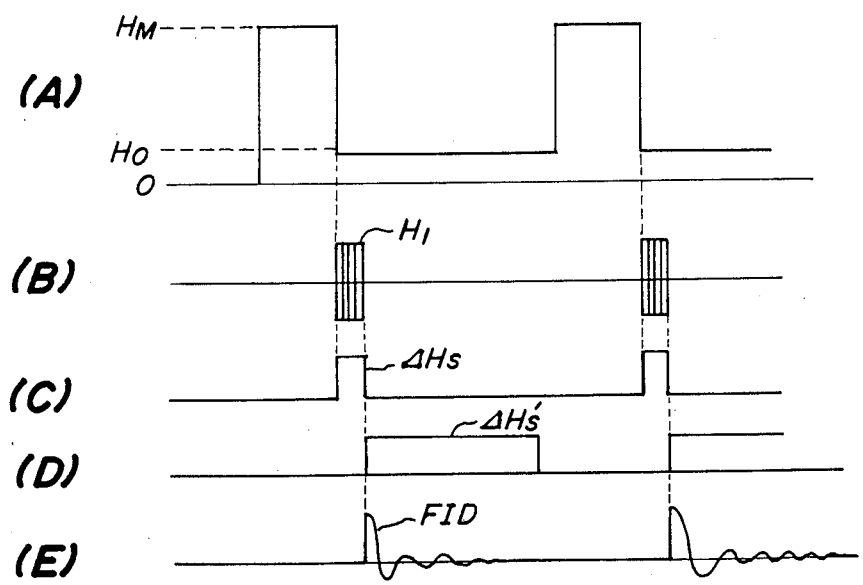

METHOD OF MEASURING INTERNAL INFORMATION FROM A TARGET BY USING NUCLEAR MAGNETIC RESONANCE

BACKGROUND OF THE INVENTION

1. Field of the Invention

This invention relates to a method of measuring internal information from a body being measured (to be referred to as a target hereinafter) by using nuclear magnetic resonance (to be referred to as NMR). More particularly, the invention relates to a method of measured internal information from a target, such as a method of obtaining an image of a cross section of the target placed in a static magnetic field by applying a high-frequency pulse-like magnetic field to a specifically selected small spatial area within the target at a time so as to cause excition of nuclear magnetization therein, detecting NMR generated thereby, and scanning the target by applying a specifying magnetic field to the target for magnetizing a selected area thereof at a time, and the invention aims at improvement of the signal-to-noise (S/N) ratio in the measurement, speeding up of the measurement, simplifying of structure of the magnetic field generator and reduction of electric power consumption.

2. Description of the Prior Art

A number of methods have been proposed heretofore for producing images of the inside of a target, such as a living body, by using internal NMR information of the target.

A typical conventional method of obtaining an image from NMR information comprises steps of exciting magnetization along a line by time-divisional combination of either applications of a high-frequency pulse-like magnetic field so as to selectively excite a specific slice-like area within a target under the presence of a linear magnetic field gradient, said pulse-like magnetic field being shaped so as to have a specific frequency spectrum, or eliminations of magnetization of all other areas of the target except the specific slice-like area, reading out distribution of spin density along said line by using a linear magnetic gradient along the line, and successively scanning the line.

The above-mentioned method of the prior art has a shortcoming in that the method is very complicated to put into practice, because the method uses the linear magnetic field gradient which requires selection of linear on line-shaped areas in the target and, to effect such selection, at least two times of magnetic field applications and switchings of the magnetic field gradient are necessary.

To produce an image from NMR information from the inside of a target such as a living body, several methods have been proposed. However, all of the previously proposed methods use comparatively big NMR magnets, because in order to form a static magnetic field for receiving the entire target cross-section, the NMR magnet is required to have an air gap length which is more than 20 times of that used for usual analysis (which is in general about 30 mm), and this dimensional requirement and weight limitations exclude the possibility of using an iron-core coil for the NMR magnet and only air-core coils have been used therefor.

Besides, it is difficult to produce a very strong magnetic field on a continuous and steady fashion, due to heat generation and other reasons. Even if water cooling is provided, a magnetic field intensity of about 2 kilogauss is an upper limit. Thus, the methods of the prior art have a shortcoming in that a magnetic field generator of fairly large scale is necessary and power consumption therein is fairly large.

In detecting the NMR signals, the problem of S/N ratio is particularly important, and it has been known that the S/N ratio in the NMR signal detection is substantially proportional to the 1.5th power of the intensity of the static magnetic field. Accordingly, from the standpoint of S/N ratio, it is preferable to use as strong a magnetic field as possible. However, in practice, one has to use a comparatively low intensity of magnetic field due to the above-mentioned reasons, and the S/N ratio obtained in each measurement has been comparatively low. Thus, in any of the conventional methods, it has been necessary to make numerous measurements so as to take an average of the thus measured values. Consequently, a considerably long measuring time has been necessary to obtain a reasonably accurate measurement. Another problem which is closely related to the S/N ratio is that of high homogeneity of the magnetic field required for the observation of the NMR signals. Fairly advanced techniques are necessary to achieve a high homogeneity in the case of a strong magnetic field, and this tends to cause a further complication in the device dealing with the NMR signals.

SUMMARY OF THE INVENTION

Therefore, an object of the present invention is to obviate the above-mentioned shortcoming of the prior art by providing an improved method of measuring internal information of a target by NMR signals.

Another object of the invention is to provide a method of generating magnetic fields for the measurement of internal information of a target, which method facilitates the measurement of not only the information in the proximity of the surface of the target but also the internal information at a deep portion within the target.

A further object of the invention is to provide a method of measuring the internal information of a target through simple procedure, in which a specific area is exclusively selected by one application of high-frequency pulse-like magnetic field thereto while using a linear or non-linear magnetic field gradient (to be referred to as a specifying magnetic field, hereinafter).

A still further object of the invention is to provide a method of measuring the internal information of a target which provides a two- or three-dimensional images with a high resolution, by forming a steep change of the magnetic field at the boundary between an area where nuclear magnetization is excited and adjacent areas where the nuclear magnetization is not excited.

Another object of the invention is to provide a method of measuring the internal information of a target with an improved S/N ratio and a reduced rate of heat and power consumption in coil for generating a static magnetic field and a specifying magnetic field and further their easiness to produce the same.

To fulfill the above-mentioned objects, a preferred method of selectively measuring internal information at a locality of a target by using the NMR phenomenon according to the present invention comprises steps of applying a step-like driving current to a static magnetic field generator which is adapted to successively produce a strong static magnetic field and a weak homogeneous static magnetic field in at least a part of the target in a short period of time; applying a specifying magnetic field to said target so as to specify a spatial locality within the target; and applying a high-frequency magnetic field to the target under the presence of said weak static magnetic field and said specifying magnetic field either continously or in a pulse-like fashion when said weak static magnetic field becomes substantially zero, said high-frequency magnetic field having a nuclear magnetic resonance frequency for the composite magnetic field of the weak homogeneous static magnetic field and the specifying magnetic field.

With the above-mentioned formation of the method of the invention, the level of the magnetization for generating the NMR signals can be maintained at a fairly high level, and it is sufficient to apply the strong magnetic field (this magnetic field is not necessarily required to be homogeneous) only during that period which is necessary for the magnetization (in general, for spin-lattice relaxation time of 2 to 3 seconds, and for a maximum period of several seconds or so in the case of using a living body as a target), whereby undesirable heat generation accompanying the magnetization can be avoided. Besides, the method of the invention eliminates the reduction of S/N ratio by the use of air-core coils, because the strong magnetization is followed by a switching to a weak homogeneous static magnetic field, and a specifying magnetic field for specifying a spatial locality (for instance, a previously proposed focussing magnetic field such as a line-shaped magnetic field, step-like magnetic field, or other linear magnetic field gradient) is simultaneously applied to the weak homogeneous static magnetic field, whereby the need of averaging of a large number of measured values is eliminated, and the number of additions for the averaging is greatly reduced. Further, the device for carrying out the method of the invention can be built in a compact form. As a result, a large rate of cost down can be carried out in comparison with using a strong homogeneous static magnetic field. Therefore, it becomes possible to provide an effective means to realize a simple polular type apparatus.

In case of a constant static magnetic field, the NMR frequency increases in proportion to the intensity of the static magnetic field and the loss in the target increases accordingly. On the other hand, in the method of the present invention, the NMR frequency at the time of actual measurement is low, so that the loss of the signals from deep inside portion of a target is small and the measurement can be effected at a high efficiency.

In a preferred embodiment of the invention, a short-circuit coil means is provided so as to form a virtual magnetic shield of the target except the area being measured, whereby adverse effects of electromotive force induced at non-measured portions of the target by any sudden change of the driving current are eliminated. The above-mentioned short-circuit coil is also effective in shielding undesirable magnetic field which may cause adverse effects on a living body.

Another embodiment of the method of the invention for measuring internal information from an inside locality of a target placed in a homogeneous magnetic field comprises steps of applying a high-frequency pulse-like magnetic field with a narrow frequency spectrum to said target at right angles to said static magnetic field, so as to generate transverse component of nuclear magnetization within the target; applying a first specifying magnetic field to the target in a pulse-like manner in synchronism with the application of said high-frequency pulse-like magnetic field thereto; applying a second specifying magnetic field to the target, so as to detect NMR signals generated by that local nuclear magnetization which is selected by the applications of the first specifying magnetic field and the high-frequency pulse-like magnetic fields; and extracting internal local information of the target from the NMR signals thus detected.

In the method having the above-mentioned organization, the central frequency of the frequency spectrum of the high-frequency pulse-like magnetic field coincides with that Larmor frequency which corresponds to that for the magnetic field intensity at the zero field gradient portion of the first specifying magnetic field with a non-linear magnetic field gradient. Besides, the pulse width thereof is selected to be long so as to make the spectral width thereof relatively narrow, so that the nuclear magnetization in an area corresponding to the spectrum is excited and a very steep boundary is formed between the area where the nuclear magnetization is excited and the areas where the nuclear magnetization is not excited and the thermal equilibrium is maintained. Whereby, the resolution of the image is further improved.

It is noted that in the method of the invention, the nuclear magnetization is selected by one application of the high-frequency magnetic field, so that the measuring procedure is made very simple and easy.

As to the thus selected local magnetization, if the first specifying magnetic field with a non-linear magnetic field gradient for selection is switched off and either of the homogeneous static magnetic field or a second specifying magnetic field for signal detection is applied thereto so as to detect nuclear magnetic signals, information covering the entire area thus selected is obtained in the case of the former, while information covering a portion of said area is obtained in the case of the latter. Accordingly, it becomes possible to carry out mapping or to produce an image of two-or three-dimentional nuclear magnetic information, by scanning both or either one of the first and second specifying magnetic field relative to the target while extracting signal therefrom.

BRIEF DESCRIPTION OF THE DRAWING

For a better understanding of the invention, reference is made to the accompanying drawings, in which:

FIG. 9 curves (A) through (E) are time charts of those signals which are used in the description of the generation of magnetic field for measuring the internal information of a target according to the present invention.

Throughout different views of the drawings, 1 is a pulse programmer, 2 is a radio frequency (RF) oscillator, 3 is a radio frequency (RF) gate, 4 is a radio frequency (RF) amplifier, 5 is a transmitter coil, 6 is a receiver coil, 7 is a preamplifier, 8 is a phase-sensitive detector, 9 is an A/D (analog-to-digital) converter, 11 is a current setter circuit, 12 is a driving current generator, 13 is a $\Delta H_s$ (specifying magnetic field) generator coil, 14 is a current magnitude controller, 15 is a large driving current generator, 16 is a large driving current source, 17 is an $H_M$ (strong static magnetic field) generator, 18 is a small driving current generator, 19 is a stabilized current source, 20 is an $H_o$ (weak homogeneous static magnetic field) generator, 21 is a computer, 22 is a peripheral device means, 31 through 34 are differential parallel four wires; a, b, and c are magnetic equipotential lines; d, d', e, and e' are differential rectangular coils; f and f' are additive circular coils; H is a static magnetic field; $H_M$ is a strong static magnetic field; $H_o$ is a weak homogeneous static magnetic field; $\Delta H_s$, $\Delta H_s'$ are specifying magnetic fields; $H_1$ is a high-frequency magnetic field; FID is a free induction decay; $R_1$ through $R_4$ are line-shaped magnetic fields; D is a target; and I, $I_M$, $I_o$ are driving currents.

DESCRIPTION OF THE PREFERRED EMBODIMENTS

Figure 1:
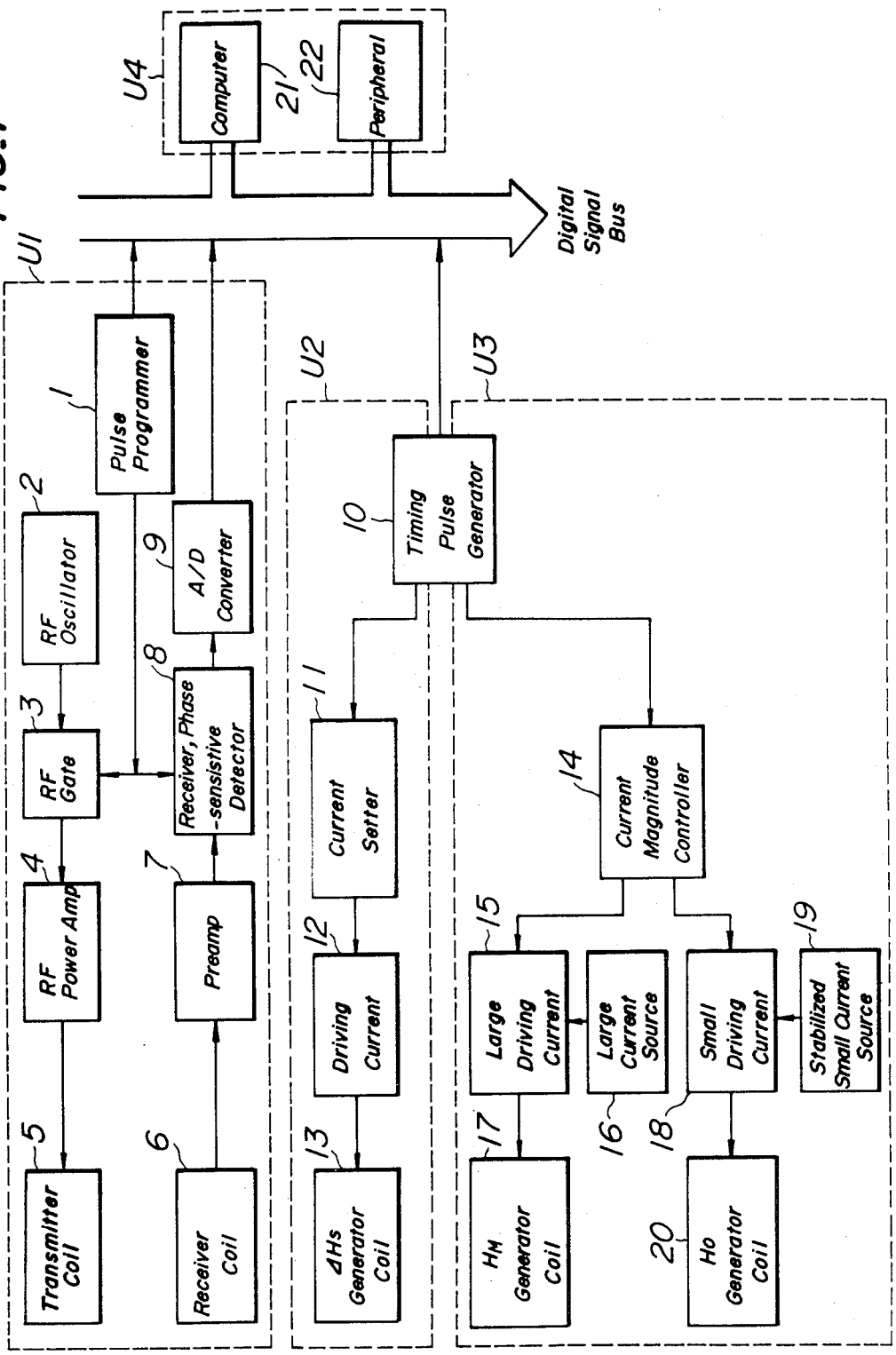
FIG. 1 is a block diagram of fundamental formation of a system which carries out a method of measuring internal information of a target according to the present invention.

Referring to FIG. 1 showing the fundamental formation of the method of the present invention, a system for carrying out the method of the invention comprises four units. The first unit U1 is an NMR device having a circuit construction which is similar to that of a conventional pulse NMR device, such as a scientific NMR device for analysis of molecular structure or any of a number of different kinds of biological NMR devices that have been proposed recently for producing images of a living body. Since the operating principles of the conventional NMR device have been known, the unit U1 will be described only briefly.

The unit U1 includes two systems, i.e., a transmitting system and a receiving system. A pulse programmer 1 produces output pulses with a predetermined pulse width and a certain series of timing, so as to gate the output from an RF oscillator 2 by means of an RF gate 3. The output from the RF oscillator 2 has a Larmor frequency of $f_o = \gamma H_o/2\pi$ which corresponds to the static magnetic field $H_o$ for observing the resonance signals. (The method of generating such static magnetic field will be described hereinafter.) Whereby, the so-called high-frequency pulse-like magnetic field (such as 90° pulses or 180° pulses) are formed, and after being amplified by an RF amplifier 4, the high-frequency magnetic field is applied to a transmitter coil 5 disposed at right angles to the static magnetic field $H_o$. A target is placed either in the transmitter coil 5 or in the proximity thereof, so that the high-frequency magnetic field is applied to the target.

After the application of the high-frequency magnetic field, a voltage is induced in a receiver coil 6 by the precession of that component of the magnetization which is perpendicular to the weak homogeneous static magnetic field $H_o$. The receiver coil 6 is also disposed perpendicular to the magnetic field $H_o$. (It is known that the transmitter coil 5 can be also used as a receiver coil, too.) The thus induced voltage is amplified by a preamplifier 7 and detected by a phase-sensitive detector 8, so that the so-called free induction decay (to be referred to as FID, hereinafter) can be observed. The FID is converted into digital signals by an A/D converter 9 and delivered to a fourth unit U4 which is a controller. The fourth unit U4 includes a computer 21 for carrying out Fourier transformation of the digital signals from the A/D converter 8 so as to provide the NMR information in the form of frequency spectrum, which NMR information contains information necessary for making images such as spin density and relaxation time. The fourth unit U4 also includes a peripheral unit 22 which has a display means for making and showing the images from the NMR information.

The first unit U1 provides only a mean value of the signals from the entire area where the high-frequency magnetic field is applied, and such mean value does not give any light to specific information at a specific spatial locality in the target, which specific information is necessary for making the images. Therefore, a non-linear specifying magnetic field $\Delta H_s$ for specifying a specific spatial locality in the target is superimposed on the static magnetic field $H_o$. The specifying magentic field is generated by a second unit U2. Fundamental operation of the second unit U2 is as follows: namely, in response to a trigger pulse from the computer 21 of the fourth unit U4, a timing pulse generator circuit 10 of the second unit U2 generates a series of pulses at specific timing intervals therebetween; based on this series of pulses, a current setter circuit 11 of the second unit U2 produces current magnitude setting signals necessary for generating the specifying magnetic field; and in response to the signals from the current setter circuit 11, a driving current generator 12 of the second unit U2 applies a driving current to a specifying magnetic field generator coil 13 so as to generate the desired specifying magnetic field $\Delta H_s$. As to the configuration of the specifying magnetic field $\Delta H_s$, there have been a number of proposals, such as the line-shaped focussing magnetic field and a star-shaped focussing magnetic field, and the inventors have disclosed the practical method of generating such magnetic fields, their characteristics, the method of scanning the focussed area and the like in Japanese Patent Application Nos. 151,172/82, 154,491/82, and 159,438/82, so that such details will not be repeated here, except the following point. Namely, the recently proposed and practiced linear magnetic field gradient having a linearly varying magnetic field gradient can be also used as the specifying magnetic field $\Delta H_s$ in the method of the present invention.

One of the essential features of the present invention is in a third unit U3 of FIG. 1, or the unit for generating the strong static magnetic field $H_M$ and the weak homogeneous static magnetic field $H_o$. More particularly, in response to a trigger pulse from the computer 21 of the fourth unit U4, the timing pulse generator circuit 10 acting for both of the second unit U2 and the third unit U3 generates a series of pulses at specific timing intervals therebetween. Based on this series of pulses, a current magnitude controller 14 activates a large driving current means 15 so as to supply a large current $I_M$ to an $H_M$ generator coil 17 so as to produce a preset strong magnetic field $H_M$. Whereby, a target placed in the coil 17 is strongly magnetized. Then, a small driving current means 18 is activated so as to supply a small current to an $H_o$ generator coil 20 from a stabilized small current source 19. Whereby, a weak homogeneous static magnetic field $H_o$ is produced for observing the NMR phenomenon caused by the strong magnetization.

Thus, in the present invention, switching is effected between the strong magnetic field for magnetization and the weak magnetic field for observing the signals. Accordingly, as compared with the conventional image display means for biological targets or living bodies which continuously produce strong homogeneous magnetic fields (in general, about 1 kG to 3 kG), the method of the invention achieves power saving without deteriorating the S/N ratio. In the embodiment of FIG. 1, separate driving current means 15 and 18 are used for the strong magnetic field $H_M$ and the weak magnetic field $H_o$, but one driving current means can be used in common for the two magnetic fields.

Figure 2:
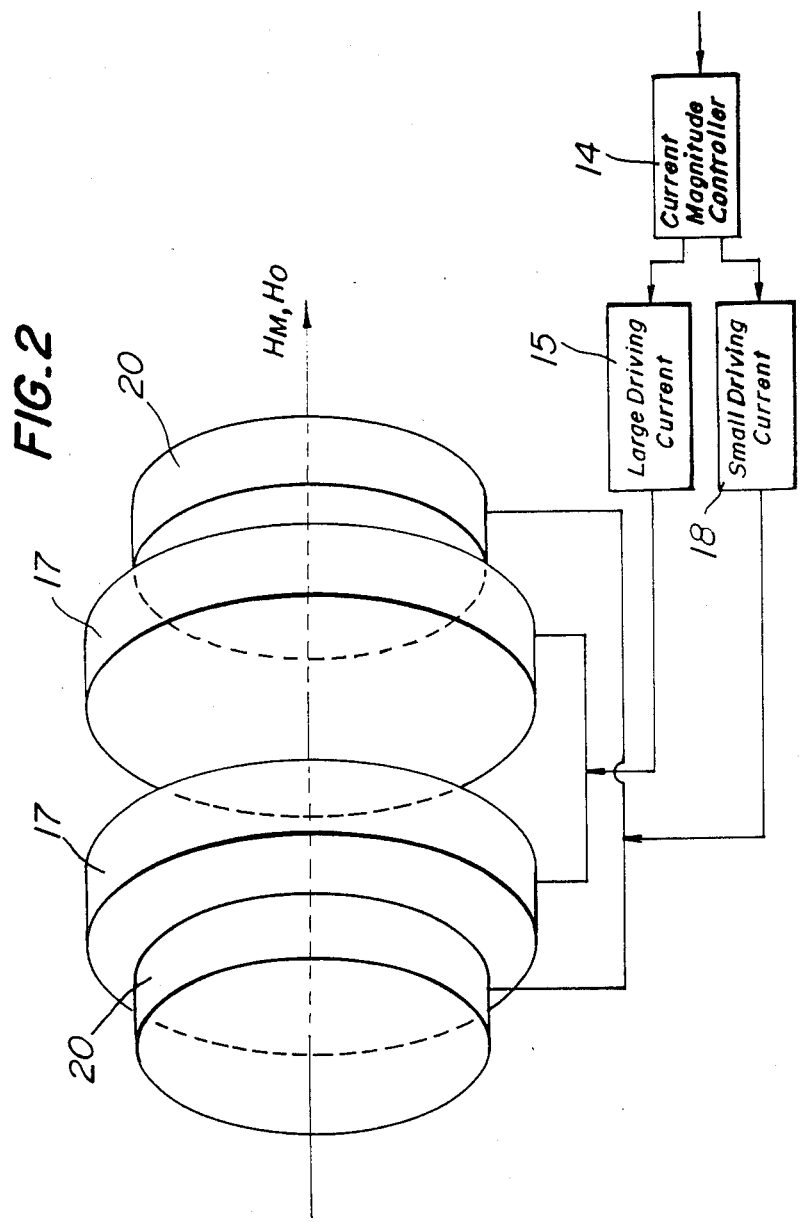
FIG. 2 is a schematic perspective view of a strong static magnetic field generator coil and a weak homogeneous static magnetic field generator coil to be used in the system of FIG. 1.

FIG. 2 schematically shows the structure of the $H_M$ (strong static magnetic field) generator coil 17 and the $H_o$ (weak homogeneous static magnetic field) generator coil 20. Several methods are available in preparing the two coils, as will be described in more detail hereinafter. As to the $H_M$ generator coil 17, the strong static magnetic field to be generated thereby is not required to be homegeneous, so that the design conditions thereof are not so strict. On the other hand, the $H_o$ generator coil 20 is required to produce a high homogeneity in the static magnetic field $H_o$ generated thereby for the observation of the NMR signals. However, the static magnetic field for the observation of the NMR signals in the method of the invention is much weaker than that of the conventional methods, so the design conditions of the $H_o$ generator coil 20 are more strict than those of the $H_M$ generator coil 17 but very simple as compared with those for producing strong homogeneous static magnetic field of the conventional methods. Thus, the present invention achieves a considerable reduction in the cost of the coils for generating the static magnetic field, which cost is generally believed to represent the largest portion of the entire system for NMR observation.

The invention will be described in further detail now by referring to a number of embodiments. In the method of measuring the internal information of a target, the target is placed in a homogeneous static magnetic field $H_o$. What is meant by "homogeneous" refers to both the so-called homogeneous case and the substantially homogeneous case. (The same apply hereinafter.) The static magnetic field $H_o$ can be either a continuously maintained field or one state of a two-level pulse-like field including a high level and a low level. The method of the invention also uses a high-frequency pulse-like magnetic field $H_1$ for selective excitation, and one example of such high-frequency magnetic field is such pulse which rotates the nuclear magnetization by 90°, which is the so-called 90° pulse. The so-called 90° pulse need not to rotate the nuclear magnetization exactly by 90° but it is sufficient to rotate the nuclear magnetization by about 90°. It is needless to say that high-frequency pulse-like magnetic field of other type can be also used in the method of the invention: for instance, a pulse which rotates the nuclear magnetization by −90° or ±270° for maximizing the transverse component thereof, or other pulses which can be expected to cause similar effects such as a divisional pulse.

Figure 3:
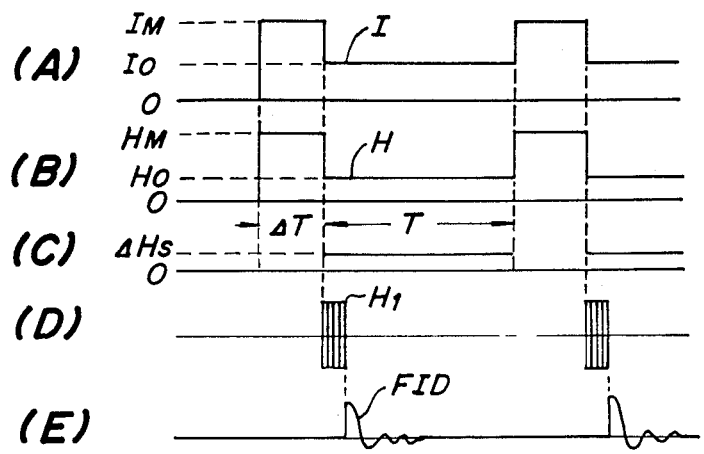
FIG. 3 curves (A) through (E) and FIG. 4 curves (A) through (F) are time charts of those signals which are used in the description of the magnetic field generation for measuring the internal information of a target in the method of the invention.

A first embodiment of the method of the invention will be described now by referring to FIG. 3. In this embodiment, a driving current varying in a step-like fashion is used, so as to provide a static magnetic field consisting of a strong static magnetic field component $H_M$ for strongly magnetizing an area being measured and a weak homogeneous static magnetic field $H_o$ (=$H_M$/m) for observing NMR signals. In FIG. 3, the curve (A) shows the driving current I for generating the static magnetic field, the curve (B) shows the static magnetic field H generated thereby, the curve (C) shows the specifying magnetic field $\Delta H_s$ of specifying a specific spatial area in the target, the curve (D) shows the high-frequency pulse-like magnetic field (to be referred to as high-frequency pulse, hereinafter) for detecting the NMR (nuclear magnetic resonance) signals, i.e., FID (free induction decay) signals, and the curve (E) shows the FID signals thus detected.

The driving current I to be applied to a static field generator has a large current portion $I_M$ for producing the strong static magnetic field $H_M$ which strongly magnetizes the area being measured (the field $H_M$ having a duration of $\Delta T$). Theoretically, the time necessary for such magnetization is similar to the spin-lattice relaxation time ($T_1$). Thus, the duration $\Delta T$ of the strong magnetic field $H_M$ must be longer than the spin-lattice relaxation time $T_1$. In the case of a target of living body, it is known that the spin-lattice relaxation time $T_1$ is about several hundreds msec to about 3 sec, and the intensity of the strong magnetic field $H_M$ with a duration $\Delta T$ of the above-mentioned length can be several kG (kiloGauss), and such strong magnetic field can be generated by an air-core coil with neglible heat generation. If averaging of measured values is necessary, such strong magnetic field can be maintained for a little longer period of time by using modest cooling of the strong magnetic field generator.

Suitable value of the duration $\Delta T$ should be selected depending on the operating conditions; namely, to have a high response, the duration $\Delta T$ should be a fraction of the spin-lattice relaxation time $T_1$, while to get each measurement with a high S/N ratio, the duration $\Delta T$ should be several times as long as the spin-lattice relaxation time $T_1$.

The driving current I is then reduced to a small current portion $I_o$ in a step-like fashion so as to generate the weak homogeneous static magnetic field $H_o$.

It is generally believed that the maximum intensity of static magnetic field which can be generated by the air-core coil without using any cooling or other large-scale auxiliaries is about several hundreds G. As compared with a measurement only with such maximum magnetic field intensity without cooling, theoretically speaking, the method of the present invention improves the S/N ratio by several tens of times. This point will be reviewed in more practical terms. Let it be assumed that a case with a continuous weak magnetic field $H_o$ and another case with a pulse-like strong magnetic field $H_M$ of m times of the weak magnetic field for a duration of $\Delta T$ are considered under the conditions that the power consumption in the two cases are the same and the measuring time with the weak magnetic field $H_o$ is T. Then, $$TH_o^2 = \Delta T H_M^2 \Delta T (mH_o)^2$$

Hence, $m = \sqrt{T/\Delta T}$.

The ratio of the S/N ratio between the two cases is given by $$(m/H_o)^{3/2}/H_o^{3/2} = m^{3/2} = (T/\Delta T)^{3/4}$$

If $T = 10$ sec and $\Delta T = 1$ sec, the above-mentioned ratio of the S/N ratio becomes about 5.6. There may remain a question of whether sufficient magnetization can be achieved with the duration $\Delta T = 1$ sec or not, but about 70% of the above-mentioned S/N ratio can be achieved without failure, which corresponds to the S/N rato of 4 ($=5.6 \times 7$). This S/N ratio of 4 corresponds to the resultant S/N ratio obtained by an averaging of 16 measured values under the weak magnetic field $H_o$ alone.

On the contrary, if it is intended to measure with the strong field $H_M$ alone after stabilizing and homogenizing such strong field, the full scale heating of the magnetic field generator must be started 2 to 3 hours before the beginning of the measurement. Accordingly, the power consumption is increased, and such measurement is not available to patients under emergency conditions. On the other hand, in the method of the invention, the magnetic field to be stabilized is a weak magnetic field $H_o$, so that it can be stabilized quickly and the power consumption is small even when the magnetic field generator is run for a long period of time.

In the method of the invention, a specifying magnetic field $\Delta H_s$ for specifying a specific spatial area within the target is applied thereto in synchronism with the generation of the above-mentioned weak magnetic field $H_o$ portion. In the embodiment of FIG. 3, the specifying magnetic field $\Delta H_s$ is applied during the time period T of the weak magnetic field. The intensity of the specifying magnetic field $\Delta H_s$ can be low as compared with the weak magnetic field $H_o$, and conventional methods of generating the specifying magnetic fields such as those proposed by the inventors and others can be used in the method of the invention. The signals representing FID of magnetization can be obtained from an arbitrarily selected specific area of the target by applying the high-frequency pulse whose frequency is the resonance frequency $f_o$ corresponding to the composite magnetic field of $(H_o + \Delta H_s)$.

When the method of the invention is practiced, the time constants for the strong magnetic field $H_M$ and for the weak magnetic field $H_o$ to reach reasonably stable levels just be carefully dealt with. Such time constants depend on the inductance of the air-core coil and stray capacitances. However, problems related to such time constants can be easily dealt with by the currently available electronic circuit techniques.

After taking one measurement in the above-mentioned manner, the next measurement can be taken by stepping up the driving current from $I_o$ to $I_M$ so as to increase the static magnetic field from $H_o$ to $H_M$ and repeating the above-mentioned processes.

In the description above, it is assumed to use a common air-core coil and a common driving power source for both of the strong magnetic field portion and the weak homogeneous magnetic field portion. It is also possible to prepare a first magnetic field generator exclusively for the strong magnetic field portion and a second magnetic field generator for the weak homogeneous magnetic field portion, and coils of such separate magnetic field generators may be disposed substantially coaxially along a common axis so as to generate the strong and the weak magnetic field in the same direction. Instead of the above-mentioned coaxial disposition, the coils of the two generators may be disposed concentrically. Such separate magnetic field generators may be connected to separate power sources, and the small current $I_o$ may be turned on in synchronism with the turning off of the large current $I_M$.

Figure 4:
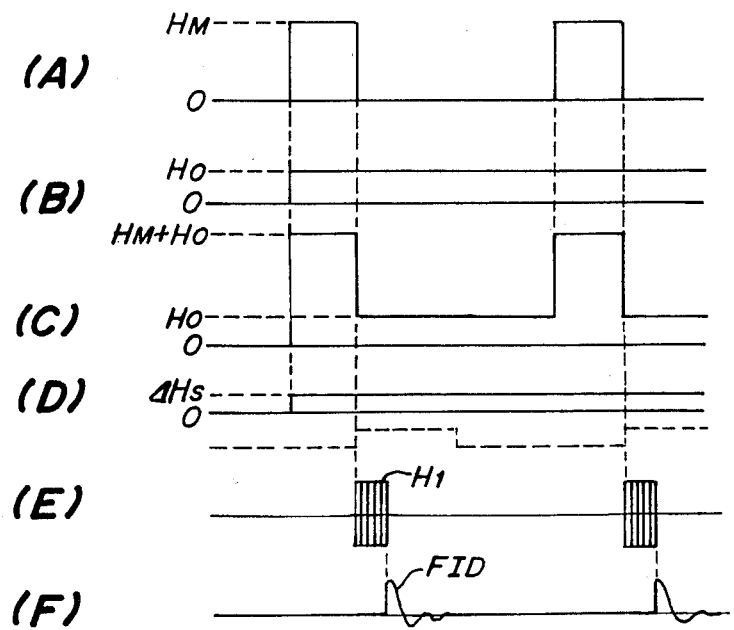

A second embodiment of the method of the invention will be described now by referring to FIG. 4. A weak magnetic field $H_o$ is continuously provided from a driving power source and the above-mentioned strong magnetic field $H_M$ is superposed thereon from a separate power source. In this embodiment, the static magnetic field H is composed of the strong magnetic field component (curve (A) of FIG. 4) and the weak magnetic field portion (curve (B) of FIG. 4), so that the magnetic field H has a strong level of $(H_M = H_o)$ and a weak level which is the weak magnetic field $H_o$ itself, as shown by the curve (C) of FIG. 4.

There are two variations in this second embodiment. The first variation is to continuously superpose the specifying magnetic field $\Delta H_s$ for specifying a spatial area of locality onto the weak magnetic field $H_o$, as shown by the solid line curves (B) and (C) of FIG. 4, and apply the high-frequency pulse $H_1$ (curve (E) of FIG. 4) in synchronism with the fall of the strong magnetic field $H_M$ (curve (A) of FIG. 4) so as to observe the FID signals (curve (F) of FIG. 4) by using a detector coil. This variation is suitable for taking a number of measurements at a certain specific locality for improving the S/N ratio by averaging, because repeated measurements can be taken simply by applying the strong magnetic field $H_M$ and the high-frequency pulse in proper synchronism, as mentioned above.

A second variation is to apply both of the specifying magnetic field $\Delta H_s$ and the high-frequency pulse $H_1$ to the target in synchronism with the fall of the strong magnetic field $H_M$. This variation is an efficient method for applying the high-frequency pulse to the target in synchronism with the scanning by the specifying magnetic field $\Delta H_s$, which specifying magnetic field is to scan a cross section of the target by specifying a spatial area or a locality. The dash lines of the curve (D) of FIG. 4 show the timing of the specifying magnetic field $\Delta H_s$ and the high-frequency pulse $H_1$ of this variation.

A third embodiment of the method of the invention will be described now by referring to FIG. 9. This third embodiment is similar to the first and the second embodiment in that the strong static magnetic field $H_M$ and the weak homogeneous static magnetic field $H_o$ are used as shown by the curve (A) of FIG. 9, and when the high-frequency pulse $H_1$ as shown by the curve (B) of FIG. 9 is applied to the target, the first specifying magnetic field $\Delta H_s$ as shown by the curve (C) of FIG. 9 is applied thereto, and then the NMR or FID signals as shown by the curve (E) of FIG. 9 are observed as a second specifying magnetic field $\Delta H_s'$ as shown by the curve (D) of FIG. 9 is applied thereto. When the timing among the various magnetic fields and the signals is set as shown in FIG. 9, if the first specifying magnetic field $\Delta H_s$ used has a non-linear magnetic field gradient, the central frequency of the frequency spectrum of the high-frequency pulse magnetic field coincides with that Larmor frequency which corresponds to the magnetic field intensity at the zero magnetic field gradient. Besides, its pulse width is selected to be wide while selecting a relatively narrow spectral width, so that nuclear magnetization is excited in an area corresponding to the spectrum, so as to provide sharp boundaries between the area where the nuclear magnetization is excited and the adjacent areas under thermal equilibrium without excitation. Whereby, the resolution of the image obtained is improved. Furthermore, if the first specifying magnetic field $\Delta H_s$ is turned off so as to switch to the second specifying magnetic field $\Delta H_s'$ for detecting the NMR signals, information can be extracted from a portion of the local magnetization area selected by the first specifying magnetic field $\Delta H_s$. Accordingly, if both or either one of the first specifying magnetic field $\Delta H_s$ and the second specifying magnetic field $\Delta H_s'$ are scanned or swept relative to the target while extracting signals therefrom, two- or three-dimensional mapping and image formation of the NMR signals can be realized and a high S/N ratio can be achieved.

In connection therewith, concrete methods of producing and measuring those specifying magnetic fields will be described.

Figure 5:
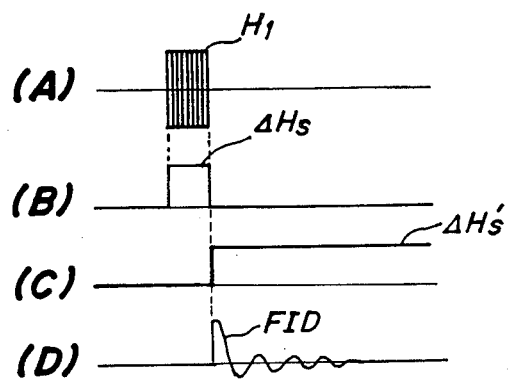
FIG. 5 curves (A) through (D) are time charts of those signal which are used in the description of the method of measuring the internal information of a target in the method of the invention.
Figure 6A:
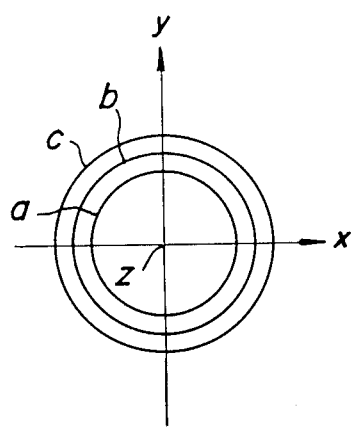
FIG. 6A, FIG. 6B, FIG. 6C, and FIG. 6D are diagrams of a line-shaped specifying magnetic field as an example of the specifying magnetic field to be used in the method of measuring the internal information of a target according to the present invention.
Figure 6B:
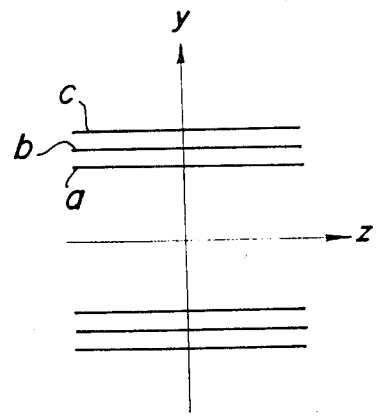
Figure 6C:
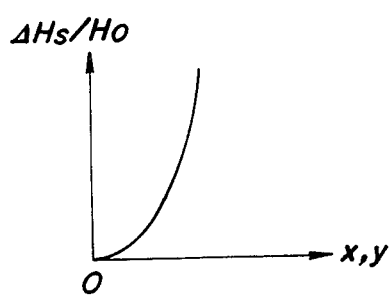

The target is placed in a homogeneous static magnetic field $H_o$, and 90° pulses $H_1$ having a magnetic field perpendicular to the static magnetic field $H_o$ with a narrow frequency spectrum are applied to the target (curve (A) of FIG. 5). Only when the 90° pulses $H_1$ are applied, the first specifying magnetic field, i.e, the magnetic field $\Delta H_s$ for selection (curve (B) of FIG. 5), is applied to the target. The pulse duration of the first specifying magnetic field $\Delta H_s$ is to be the same as that of the 90° pulses $H_1$ at the largest. In this embodiment, the first specifying magnetic field $\Delta H_s$ is a line-shaped magnetic field. Referring to FIGS. 6A through 6C, this line-shaped specifying magnetic field (to be referred to as line-shaped field, hereinafter) has a central axis represented by the z-axis, and two perpendicular axes, i.e., the x-axis and the y-axis, intersect the z-axis at right angles. Magnetic equipotential or equal intensity surfaces a, b, and c extends coaxially along the central z-axis which has the lowest magnetic field intensity. The magnetic equipotential surfaces a, b, and c fulfill the conditions of $(\Delta H_s/H_o)=$ constant and are of cylindrical shape extending through almost the entire region where the target is located. Referring to FIG. 6C, the variation of the magnetic field intensity or the magnetic field gradient in the cross section of the cylindrical equipotential surfaces is comparatively small in the proximity of the central z-axis but rapidly increases as the distance from the z-axis increases in the x-y plane.

Figure 6D:
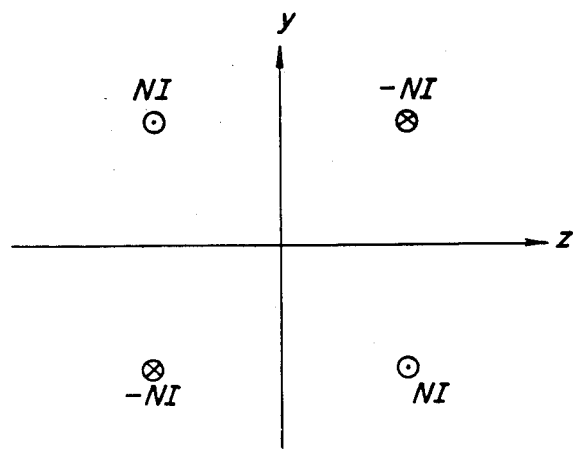

In FIGS. 6A and 6B, each of the magnetic equipotential surfaces a, b, and c meets the condition of $(\Delta H_s/H_o)=$ constant. In the graph of FIG. 6C, the abscissa represents the above-mentioned x-axis and y-axis, while the ordinate represents the value of $(\Delta H_s/H_o)$. The line-shaped field is generated by a line-shaped field genertor, an example of which is shown in FIG. 6D. The illustrated line-shaped field generator has four parallel wires and a power source (not shown) for supplying currents to the wires. The four wires are disposed in parallel to the direction of the static magnetic field $H_o$ and electric currents are supplied to the four wires in such a manner that the currents in the adjacent wires flow in opposite directions as shown in FIG. 6D, whereby the line-shaped field is produced. When a combination of the thus produced line-shaped field and the above-mentioned 90° pulses with a narrow frequency spectrum is applied to the target, the nuclear magnetization is selectively excited only in the line-shaped region in the proximity of the central axis so as to cause 90° rotation of the nuclear magnetization thereat, while leaving the remaining portions of the target in almost thermal equilibrium substantially without being affected. It should be noted here that, when the static magnetic field $H_o$ is strong, the AT (ampere-turns) for producing the line-shaped field $\alpha H_s$ increases almost in proportion to the square of the static field $H_o^2$ (Yamada et al, paper No. MBE78-68 (1979) of Medical Electronics Bioengineering Conference of Institute of Electrical Communication Engineers of Japan), so that the current for generating the specifying field $\Delta H_s$ increases with the increase of the static magnetic field $H_o$. Accordingly, the use of the pulse-shaped driving current in applying the static magnetic field $H_o$ has an advantage of reducing the size of the power source therefor. Besides, the stability requirement on the line-shaped field $\Delta H_s$ is far less severe than that for the static magnetic field $H_o$, so that design conditions for the equipment to carry out the method of the invention can be simplified.

The method of reading out the nuclear magnetic information from the line-shaped area which is selectively excited will be described now. There are several methods available for this readout, and a first method will be dealt within in the beginning. In a preferred example of the first method, when the line-shaped field $\Delta H_s$ is turned off, a signal-detecting special field or the second specifying magnetic field $\Delta H_s'$ (curve (C) of FIG. 5) is applied to the target simultaneously with the turning off, which second specifying magnetic field has a linearly varying magnetic field intensity or a linear field gradient in the longitudinal direction of the line-shaped area. As to the timing of applying the second specifying magnetic field $\Delta H_s'$, it is preferably to select such timing which ensures effective extraction of the FID signals by considering the fact that the NMR signals, i.e., the FID signals, are generated at the moment when the 90°0 pulses $H_1$ disappear. If the second specifying magnetic field is applied in the above-mentioned manner, a detector coil can detect the NMR signals, i.e., FID signals (curve (D) of FIG. 5) from the line-shaped area wherein each point has a different Larmor frequency, and when various frequency components of the thus obtained FID signals are determined either by Fourier transformation thereof or by passing the FID signals through a multi-channel frequency analyzer of analog type, the distribution of the spin density in the line-shaped area can be measured by one measurement, and if the measurement is made while scanning the line-shaped field $\Delta H_s$, an image of spin density distribution on the plane thus scanned can be obtained.

A second method of the readout of the NMR signals or FID signals comprises steps of applying a second specifying signal to the target which second specifying signal, for instance, has a non-linear step-like change of the intensity of magnetic field along the selected longitudinal direction of the line-shaped area and obtaining the NMR signals at those areas where the magnetic field gradient of each step is zero. What is meant by "that magnetic field gradient is zero" refers to both of the case in which the magnetic field gradient is at the so-called zero and the case in which the magnetic field gradient is substantially zero (the same applies hereinafter). If the second specifying magnetic field of this second method has N steps disposed in the longitudinal direction of the line-shaped area, then the field being measured is divided into N frequency components. Accordingly, in this second method, the second specifying magnetic field $\Delta H_s'$ can be a step-like magnetic field having that number of steps which is the same as the required number of measuring points, and the FID signals (NMR signals) obtained may be processed by frequency analysis through either Fourier transformation or a multi-channel frequency analyzer.

As compared with the above-mentioned first method using the linear magnetic field gradient, each of the measuring points selected along the longitudinal direction of the line-shaped area in the second method has a smaller spread of the Larmor frequency distribution, so that the second method is advantageous from the standpoint of the S/N ratio.

One of the methods of producing the step-like specifying magnetic field is to superpose those synchronous changes of magnetic field gradient onto the linear magnetic field gradient along the longitudinal direction of the line-shaped area which changes are produced by a number of parallel wires disposed at right angles to the above-mentioned longitudinal direction.

A fourth embodiment of the method of the invention will be described now. This embodiment is a method to obtain the information from one point in the line-shaped area which point is selected by the above-mentioned line-shaped field and the 90° pulse $H_1$, so that the fourth embodiment is a simplification of the third embodiment.

In the fourth embodiment, the second specifying magnetic field or the non-linear magnetic gradient $\Delta H_s'$ for reading out the signals can be formed either by a specifying magnetic field generated by a pair of circular coils which ae disposed so as to produce a portion having a zero magnetic gradient (zero magnetic gradient portion) at a point on the above-mentioned longitudinal direction of the line-shaped area or by a non-linear magnetic field gradient having a zero magnetic gradient at a point on the above-mentioned longitudinal direction and planar magnetic equipotential surfaces. In the fouth embodiment of such formation, if it is desired to obtain signals from a selected point of the line-shaped area, the band width of the detector amplifier can be made narrow so as to provide a high S/N ratio and the need of frequency analysis is eliminated so as to simplify the measurement. It is needless to say, instead of the above-mentioned methods, the detection of the signals at a selected point in the line-shaped area can be carried out by using the linear magnetic field gradient or the step-like magnetic field gradient of the first embodiment so as to extract only one frequency component.

In this case, if the specifying magnetic field $\Delta H_s$ for selection in the line-shaped area is scanned on a plane which is perpendicular to the longitudinal direction, a tomographic image in a direction perpendicular to the line-shaped field can be obtained. Furthermore, if the specifying magnetic field $\Delta H_s'$ for signal readout is scanned in addition to the scanning of the line-shaped field, a tomographic image in an oblique direction can be obtained.

Figure 7A:
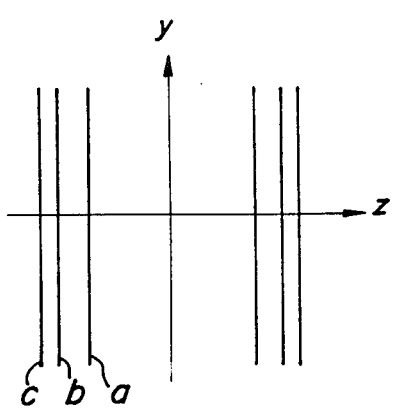
FIG. 7A, FIG. 7B, FIG. 7C, and FIG. 7D are diagrams of a planar specifying magnetic field as another example of the specifying magnetic field to be used in the method of measuring the internal information of a target according to the present invention.
Figure 7B:
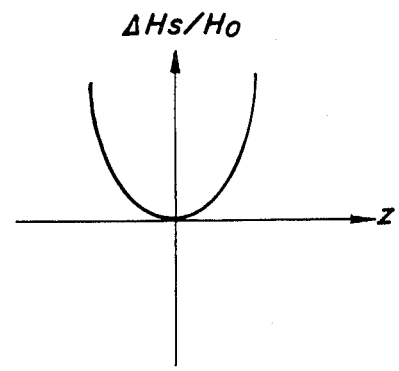

A fifth embodiment of the method of the invention will be described now by referring to FIGS. 7A through 7D. In the fifth embodiment, the first specifying magnetic field or the non-linear magnetic field gradient $\Delta H_s$ selection is formed of a planar specifying magnetic field as shown in FIG. 7A and FIG. 7B. In FIG. 7A showing equipotential lines of the planar specifying magnetic field, the plane where the magnetic field gradient is zero is designated as an x-y plane, and the z-axis is taken at right angles to the x-y axis plane. Examples of the equipotential lines under the conditions of $\Delta H_s/H_o=$ constant are shown by the lines a, b, and c. The graph of FIG. 7B shows the manner in which the value of $\Delta H_s/H_o$ varies with the distance from the plane of zero magnetic field gradient. Thus, the planer specifying magnetic field to be used in the fifth embodiment, for instance, has a zero magnetic field gradient on a certain plane, and the magnetic field gradient thereof increases rapidly with the distance from the certain plane. The plane where the magnetic field gradient is substantially zero is selected by a 90° pulse $H_1$ with a narrow spectrum width. This method corresponds to that in which the functions of the non-linear magnetic gradient $\Delta H_s$ for selection and the non-linear magnetic gradient $\Delta H_s'$ for signal readout of the second embodiment are exchanged with each other. With the method of the fifth embodiment, the nuclear magnetization of each slice-like area of the target can be rotated by 90°, and the line-shaped magnetic field passing through the slice-like area can provide the NMR signals at the intersection therebetween, and a tomographic image of a scanning plane at the intersection can be obtained through scanning by one or both of the above-mentioned two magnetic field gradients.

Figure 7C:
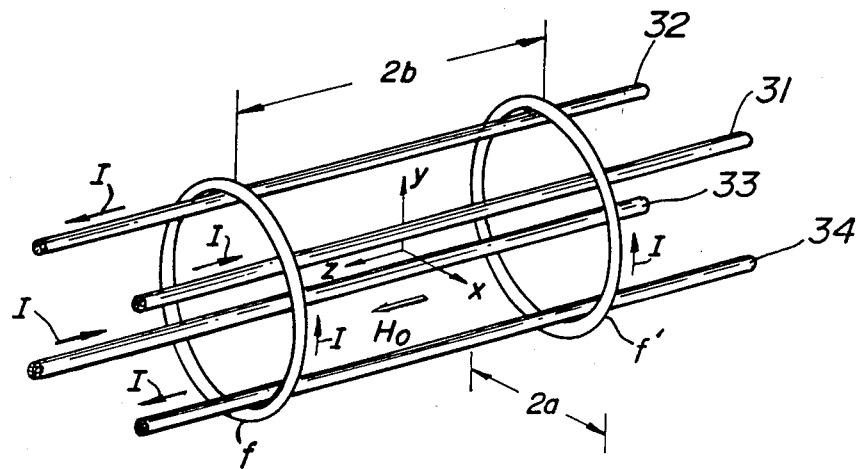

The planar specifying magnetic field to be used in the fifth embodiment can be produced by using a combination of a line-shaped magnetic field generator having differential parallel four wires 31 through 34 and a pair of additive circular coils f, f' as shown in FIG. 7C, and a closed loop coil means adapted to produce a magnetic field whose intensity increases in the longitudinal direction of line-shaped magnetic field in a square curve fashion as the field extends in said direction but decreases in a direction perpendicular to said longitudinal direction in an inverse to square curve fashion, while the values of the currents are set so as to cancel the substantially square curved reduction of the magnetic field intensity of the line-shaped specifying magnetic field. When the above-mentioned combination is used, in a certain plane perpendicular to the direction of the static magnetic field the magnetic field intensity is minimized, and as the distance from the certain plane increases in either of the two perpendicular directions, the magnetic field intensity increases, so that the desired planar specifying magnetic field is formed.

It is also possible to produce the desired effect by superposing such magnetic field onto the homogeneous static magnetic field $H_o$ which has only transverse components perpendicular to the static magnetic field and whose intensity varies linearly in the direction of the static magnetic field with a zero intensity at a certain plane.

Figure 7D:
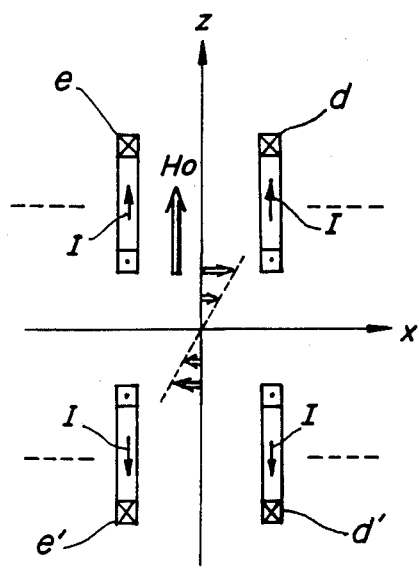

Referring to FIG. 7D, the planar specifying magnetic field of the fifth embodiment can be also produced as an approximation in the neighbourhood of the central portions of a combination of two pairs of rectangular differential coils d, d' and e, e' which are disposed in the static magnetic field on a plane parallel to the direction of the static magnetic field.

The so-called linear magnetic field gradient, which is a kind of planar specifying magnetic fields and is often used in NMR imaging process, can be also used for a purpose similar to that of the above-mentioned planar specifying magnetic field having a magnetic field intensity varying in a square curve fashion. However, that planer specifying magnetic field with non-linear magnetic field gradient which has been described hereinbefore by referring to the fifth embodiment of the invention has an advantage of defining the slice-like areas more sharply.

Figure 8A:
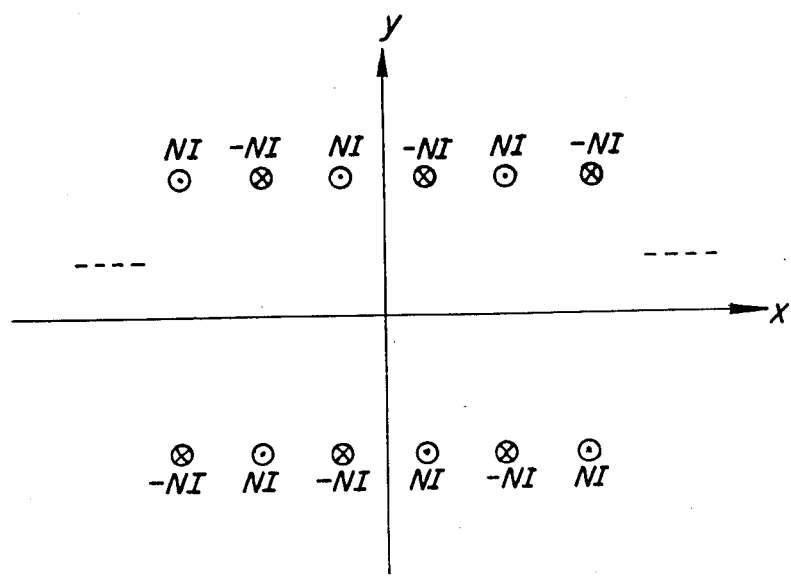
FIG. 8A and FIG. 8B are schematic diagrams which are used in the description of an embodiment of the method of measuring the internal information of a target according to the present invention.
Figure 8B:
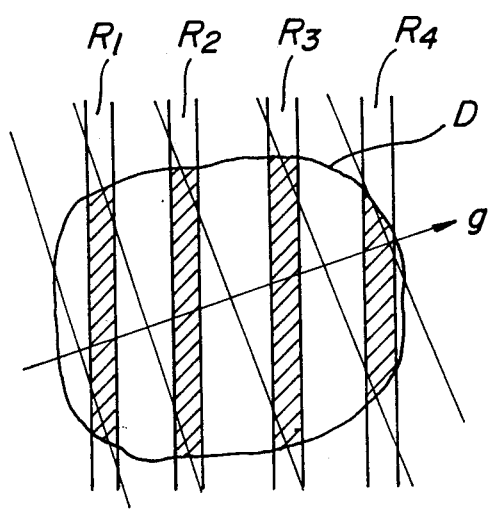

A sixth embodiment of the method of the invention will be described now by referring to FIG. 8A and FIG. 8B. The sixth embodiment relates to a high-speed imaging process which detects the informations of a plane to be imaged at a time, so as to realize a very short imaging time or time necessary for producing an image. Referring to FIG. 8A and FIG. 8B, the sixth embodiment uses a first specifying field or a specifying field $\Delta H_s$ for selection which has a plurality of parallel line-spaced areas (for instance, areas $R_1$ through $R_4$ of FIG. 8A). When this specifying magnetic field is applied to the target in synchronism with the high-frequency pulse $H_1$ for selective excitation, the nuclear magnetizations of a plurality of parallel line-shaped areas can be excited at a time. The areas with the thus excited nuclear magnetization are shown by the shading in the figure. In this case, the magnetic field intensities at the central portions of the plurality of line-shaped fields are made substantially the same with each other, so that the frequency spectrum of the high-frequency pulse $H_1$ for selective excitation can be that of narrow single band type. Then, as the second specifying magnetic field or the specifying magnetic field $\Delta H_s'$ for readout, which has a linear magnetic field gradient in the direction as shown by the arrow g of FIG. 8B, is applied to the target, all the line-shaped areas with the magnetization thereof excited become to have different Larmor frequencies, so that the spin density distributions of all the line-shaped areas can be measured at a time by frequency analysis of the FID signals obtained. In the method of this embodiment, the narrower the intervals between the adjacent line-shaped areas are, the closer to 90° the angle of the gradient of the specifying magnetic field for readout becomes, so as to cause shortcomings of reducing the resolution in the longitudinal direction of the line-shaped areas and an increase in the difficulty of the adjustment of the direction. Accordingly, the above-mentioned intervals cannot be made too short. In practice, it is preferable to use a suitable number of the parallel line-shaped areas and to scan all of them, so as to cover the entire plane measured. Even under the preferred arrangement, the advantage of reducing the imaging time depending on the number of the line-shaped areas can be realized.

Besides, it is also possible to use that specifying magnetic field for readout which is formed of step-like magnetic field gradient.

In each of the above-mentioned embodiments, homogeneous static magnetic field is used, and if such static magnetic field is of two-valued pulse-like field with a strong intensity and a weak intensity of magnetic field, the above-mentioned high-frequency pulse $H_1$ is applied during the weak magnetic field intensity period. In each of the embodiments, if the second specifying magnetic field $\Delta H_s'$ is substituted either by the homogeneous static magnetic field $H_o$ or by the first specifying magnetic field $\Delta H_s$, the local information at the area selected by the homogeneous static magnetic field or the first specifying magnetic field can be obtained. On the other hand, if the second specifying magnetic field $\Delta H_s'$ is a specifying magnetic field different from either of $H_o$ and $\Delta H_s$, the local information at the area selected by the superposition of the former and the latter can be obtained.

Furtermore, after a specific area of the target is selectively excited by the first specifying magnetic field $\Delta H_s$, if the homogeneous static magnetic field $H_o$ is used for signal readout instead of the second specifying magnetic field $\Delta H_s'$, the FID signals are free from the phase rotation caused by the specifying of the spatial locality, so that they includes all the NMR information at the specific area or locality thus selected. Accordingly, Fourier transformation of the FID signals thus obtained will provide the resonance spectrum at the locality thus selected, so that information concerning the chemical shift can be detected therefrom. Recently, much attention has been paid to the collection of metabolic information from a locality of a living body by using the chemical shift of phosphorus ($^{31}P$) or the like, besides the conventional hydrogen nucleus ($^1H$). The method of the invention facilitates not only the collection of such information from specific localities of the target, but also preparation of an image of the entire plane being measured based on the chemical shift information thereat through scanning with the first specifying magnetic field $\Delta H_s$.

It should be noted here that the direction of the magnetic fields to be applied to a target in each of the above-mentioned embodiments should preferably be as follows: namely, the static magnetic field $H_o$, the first specifying magnetic field $\Delta H_s$, and the second specifying magnetic field $\Delta H_s'$ should preferably be parallel to each other; the directions of the high-frequency pulse $H_1$ and the detector coil of the NMR signals should preferably be perpendicular to the above-mentioned magnetic fields $H_o$, $\Delta H_s$, and $\Delta H_s'$; and the high-frequency pulse $H_1$ and the direction of the detector coil should preferably be parallel or perpendicular.

A seventh embodiment of the method of the invention will be described now. This embodiment relates to a method of using a means for avoiding adverse effects of that electromotive force on the target which is induced by the change of magnetic flux at the time of quick switching of the static magnetic field from $H_M$ to $H_o$ or from $H_o$ to $H_M$ in the above-mentioned fifth and sixth embodiments. In general, the static magnetic field H including the strong and the weak field $H_M$ and $H_o$ and the specifying magnetic field $\Delta H_s$ are arranged in parallel to each other, and the directions of the high-frequency pulse and the detector coil are set at right angles to the magnetic fields, while orienting the high-frequency pulse and the detector coil in parallel or at right angles to each other, so that the need of the countermeasures against the quick change related to the strong magnetic field $H_M$ appears to be remote. However, in practice, the apparatus for carrying the method of the invention is exposed to unforeseeable risk of the adverse effects of sudden change of the strong magnetic field $H_M$, so that it is preferable to provide the following protective means.

A first method of the protection is a kind of automatic compensation by diposing a one-turn coil with a very small electric resistance at a position to be magnetically shielded, so as to prevent the variation of the magnetic flux at the switching of the driving current from affecting the portions other than the locality being measured. The one-turn coil can be, of course, modified depending on the specific shielding requirement by increasing the number of turns or by broadening the conductor of the coil. It is also possible to assign a suitable time constant to the one-turn or short-circuit coil and to provide a switching means in the short-circuit coil so as to selectively disconnect the coil for preventing adverse affects on other measurements.

A second method of the protection is to slow down the change by gradually increasing or reducing the intensity of the magnetic field step by steps to the strong field $H_M$ or to the weak field $H_o$ without causing any quick change of the magnetic field intensity in a short period of time, or by assigning a suitable time constant in the power source of the driving current. In considering the safety of a living body from magnetic field, especially in the case that the quick change of magnetic field is a possible cause of the worst influence, a suitable protective means such as those described above must be provided. It is apparent to those skilled in the art that the above-mentioned time constant can be suitably determined by considering maximum allowable time limits and other factors.

As to the effects of the interruption of the strong magnetic field $H_M$ and the high-frequency pulse $H_1$ on the living body, the electromotive force induced in the living body is proportional to (change in magnetic flux/time for the change), and it is noted that the effect of the regularly used high-frequency pulse $H_1$ is larger than the other.

In each of the embodiments described above, the specifying magnetic field $\Delta H_s$ can be applied continuously or intermittently, provided that the duration of such magnetic field is substantially the same as or longer than the duration of the high-frequency pulse. It is necessary to generate the high-frequency pulse $H_1$ during the period when the specifying magnetic field $\Delta H_s$ is generated.

As to the structure of the generators of the strong and the weak static magnetic field $H_M$ and $H_o$, if the coil for the weak static magnetic field $H_o$ is disposed in the coil for the strong static magnetic field $H_M$ and the two coils are thermally insulated from each other, adverse thermal effects on the weak static magnetic field $H_o$ can be easily eliminated.

As described in detail in the foregoing by referring to preferred embodiments, the method of the present invention provides the following features. Namely, the strong magnetic field $H_M$ provides a pulse-like field and this strong field $H_M$ is substantially free from any strict requirement of stability and homegeneity, so that the air-core coil for the strong magnetic field does not require cooling or other complicated auxiliaries, and the pulse-like magnetic field also facilitates not only a reduction of the heating time from the switch-on until the start of measuring operation but also a reduction in the power consumption. Accordingly, even if a strong magnetic field generator such as a super-conductive magnet is used, the method of the present invention provides a high S/N ratio and a low error level, despite the fact that such strong magnetic field generator is accompanied with a very high resonance frequency and an increased loss in living body target. Besides, the method of the invention minimizes the need of averaging a large number of measured values, so that the measuring time is considerably shortened. In short, the method of the invention facilitates production of a simple apparatus for measuring internal informations from a target by using the NMR phenomenon which apparatus has a very high performance characteristics.

Although the invention has been described with a certain degree of particularity, it is understood that the present disclosure has been made only by way of example and that numerous changes in details of construction and the combination and arrangement of parts may be resorted to without departing from the scope of the invention as hereinafter claimed.

What is claimed is:

1. A method of selectively measuring internal information from a target, comprising the steps of
    applying a step-like driving current to a static magnetic field generator which is adapted to successively produce a strong static magnetic field $H_M$ and a weak homogeneous static magnetic field $H_o$ in at least a part of the target in a short period of time;
    applying a specifying magnetic field $\Delta H_s$ to said target so as to specify a spatial locality within the target; and
    applying a high-frequency magnetic field $H_1$ to the target under the presence of said weak static magnetic field $H_o$ and said specifying magnetic field $\Delta H_s$, said high-frequency magnetic field $H_1$ having a nuclear magnetic resonance frequency $f_o$ for the composite magnetic field $(H_o + \Delta H_s)$.

2. A method as set forth in claim 1, wherein said high-frequency magnetic field $H_1$ is continuously applied.

3. A method as set forth in claim 1, wherein said high-frequency magnetic field $H_1$ is intermittently applied.

4. A method as set forth in claim 1, wherein said static magnetic field generator consists of a coil means such that both of the strong magnetic field $H_M$ and the weak homogeneous static magnetic field $H_o$ are generated by the coil means in an alternate fashion.

5. A method as set forth in claim 1, wherein said static magnetic field generator consists of a first coil means for generating a strong static magnetic field and a second coil means for generating a weak homogeneous static magnetic field, and the driving current applied to the second coil means is such that the weak homogeneous static magnetic field $H_o$ is continuously generated by the second coil means.

6. A method as set forth in claim 1, wherein said static magnetic field generator consists of a first coil means for generating a strong static magnetic field and a second coil means for generating a weak homogeneous static magnetic field, and the driving current applied to the second coil means is such that the weak homogeneous static magnetic field $H_o$ is intermittently generated by the second coil means in synchronism with fall of each strong static magnetic field generated by said first coil means.

7. A method as set forth in claim 1, wherein said specifying magnetic field $\Delta H_s$ is applied for a duration which is substantially not shorter than a duration of said high-frequency magnetic field $H_1$.

8. A method as set forth in claim 1, wherein a measuring zone under direct influence of said driving current for generating said strong static magnetic field $H_M$ is magnetically shielded by a short-circuited coil, so as to prevent effects of electromotive force induced by said driving current from reaching to outside of said measuring zone.

9. A method as set forth in claim 1, wherein said first specifying magnetic field $\Delta H_s$ for specifying a spatial locality within the target is applied to the target in synchronism with said high-frequency magnetic field $H_1$, so as to selectively excite local nuclear magnetization, and a second specifying magnetic field $\Delta H_s'$ is applied to said target so as to detect nuclear magnetic resonance signals caused by said excited local nuclear magnetization.

10. A method as set forth in claim 1, wherein said first specifying magnetic field $\Delta H_s$ for selectively exciting local nuclear magnetization is a line-shaped specifying magnetic field having a minimum magnetic field intensity at a center thereof and having cylindrical magnetic equal intensity surfaces about the center, said equal intensity surfaces extending substantially to a full extent of a magnitude of said target being measured, a variation of magnetic field intensity of said line-shaped specifying magnetic field on a cross-sectional plane thereof being slow in proximity of the center thereof and increasing rapidly with distance from the center;
- said second specifying magnetic field $\Delta H_s'$ has a linear variation of magnetic field intensity along a longitudinal direction of a line-shaped portion of the target being measured where the local nuclear magnetization is excited by said line-shaped specifying magnetic field; and
- local information in the longitudinal direction of said line-shaped portion of the target is extracted by frequency analysis of said nuclear magnetic resonance signals.

11. A method as set forth in claim 1, wherein said first specifying magnetic field $\Delta H_s$ for selectively exciting local nuclear magnetization is a line-shaped specifying magnetic field having a minimum magnetic field intensity at a center thereof and having cylindrical magnetic equal intensity surfaces about the center, said equal intensity surfaces extending substantially to a full extent of a magnitude of said target being measured, a variation of magnetic field intensity of said line-shaped specifying magnetic field on a cross-sectional plane thereof being slow in proximity of the center thereof and increasing rapidly with distance from the center;
- said second specifying magnetic field $\Delta H_s'$ has a non-linear variation of magnetic field intensity, including a zero-gradient portion and a steep gradient portion along a longitudinal direction of a line-shaped portion of the target being measured where the local nuclear magnetization is excited by said line-shaped specifying magnetic field; and
- local information at a point in said line-shaped portion of the target is extracted by detecting those frequency components from said nuclear magnetic resonance signals which correspond to those substantially at said zero-gradient portion.

12. A method as set forth in claim 1, wherein said first specifying magnetic field $\Delta H_s$ for selectively exciting local nuclear magnetization is a planar specifying magnetic field having such a non-linear gradient of magnetic field intensity that planar equal intensity surfaces are provided with a minimum magnetic field intensity on a certain plane where magnetic field gradient is zero, while the magnetic field intensity increases rapidly with distance from said certain plane, so that the first specifying magnetic field excites nuclear magnetization in slice-like portions of the target being measured where the magnetic field gradient is zero; and
- said second specifying magnetic field $\Delta H_s'$ is a line-shaped specifying magnetic field having a minimum magnetic field intensity at a center thereof and having cylindrical magnetic equal intensity surfaces about the center, said equal intensity surfaces extending substantially to a full extent of a magnitude of said target being measured, a variation of magnetic field intensity of said line-shaped specifying magnetic field on a cross-sectional plane thereof being slow in proximity of the center thereof and increasing rapidly with distance from the center.

13. A method as set forth in claim 1, wherein said first specifying magnetic field $\Delta H_s$ for selectively exciting local nuclear magnetization is a line-shaped specifying magnetic field having a minimum magnetic field intensity at a center thereof and having cylindrical magnetic equal intensity surfaces about the center, said equal intensity surfaces extending substantially to a full extent of a magnitude of said target being measured, a variation of magnetic field intensity of said line-shaped specifying magnetic field on a cross-sectional plane thereof being slow in proximity of the center thereof and increasing rapidly with distance from the center;
- said second specifying magnetic field $\Delta H_s'$ is a step-like specifying magnetic field having a step-like variation of magnetic field intensity, including a zero-gradient portion and a steep gradient portion located alternately along a longitudinal direction of a line-shaped portion of the target being measured where the local nuclear magnetization is excited by said line-shaped specifying magnetic field; and
- local information at diversified points corresponding to different steps of the step-like variation of magnetic field intensity in said line-shaped portion of the target are simultaneously extracted from said nuclear magnetic resonance signals by detecting those frequency components which correspond to those of flat portions of said steps.

14. A method as set forth in claim 1, wherein said first specifying magnetic field $\Delta H_s$ for selectively exciting local nuclear magnetization has a number of parallel line-shaped magnetic fields each of which includes closed cylindrical magnetic equal intensity surfaces, so that nuclear magnetizations at a number of parallel line-shaped portions of the target under said line-shaped magnetic field can be simultaneously excited;
- said second specifying magnetic field $\Delta H_s'$ is a magnetic field having such a varying intensity of magnetic field and intersecting said parallel line-shaped portions of the target with such an angle that all points in the thus intersected parts of said parallel line-shaped portions with excited nuclear magnetization are in different Larmor frequency regions and;
- local information at a number of intersections being simultaneously extracted from said nuclear magnetic resonance signals.

15. A method as set forth in claim 14, wherein said second specifying magnetic field $\Delta H_s'$ is a magnetic field having a linearly varying intensity of magnetic field.

16. A method as set forth in claim 14, wherein said second specifying magnetic field $\Delta H_s'$ is a magnetic field whose intensity of magnetic field varies in steps.

17. A method of measuring internal information from inside of a target, comprising the steps of:
- applying a static magnetic field H to the target in one direction;
- applying a high-frequency pulse-like magnetic field $H_1$ at right angles to said static magnetic field H, so as to maximize a transverse component of nuclear magnetization within the target;
- selectively exciting local nuclear magnetization in the target by applying a first specifying magnetic field $\Delta H_s$ to said target in synchronism with said high-frequency pulse-like magnetic field $H_1$, said first specifying magnetic field having a non-linear magnetic gradient;

detecting nuclear magnetic resonance signals generated by said local nuclear magnetization thus excited, by applying a second specifying magnetic field $\Delta H_s'$ to the target; and extracting internal information of the target from the nuclear magnetic resonance signals thus detected;

said first specifying magnetic field $\Delta H_s$ for selectively exciting local nuclear magnetization comprising a line-shaped specifying magnetic field having a minimum magnetic field intensity at a center thereof and having cylindrical magnetic equal intensity surfaces about the center, said equal intensity surfaces extending substantially to a full extent of a magnitude of said target being measured, a variation of magnetic field intensity of said line-shaped specifying magnetic field on a cross-sectional plane thereof being slow in proximity of the center thereof and increasing rapidly with distance from the center;

said second specifying magnetic field $\Delta H_s'$ having a linear variation of magnetic field intensity along a longitudinal direction of a line-shaped portion of the target being measured where local nuclear magnetization is excited by said line-shaped specifying magnetic field; and local information in a longitudinal direction of said line-shaped portion of the target is extracted by frequency analysis of said nuclear magnetic resonance signals.

18. A method of measuring internal information from inside of a target, comprising the steps of:

applying a static magnetic field H to the target in one direction;

applying a high-frequency pulse-like magnetic field $H_1$ at right angles to said static magnetic field H, so as to maximize a transverse component of nuclear magnetization within the target;

selectively exciting local nuclear magnetization in the target by applying a first specifying magnetic field $\Delta H_s$ to said target in synchronism with said high-frequency pulse-like magnetic field $H_1$, said first specifying magnetic field having a non-linear magnetic gradient;

detecting nuclear magnetic resonance signals generated by said local nuclear magnetization thus excited, by applying a second specifying magnetic field $\Delta H_s'$ to the target; and extracting internal information of the target from the nuclear magnetic resonance signals thus detected;

said first specifying magnetic field $\Delta H_s$ for selectively exciting local nuclear magnetization comprising a line-shaped specifying magnetic field having a minimum magnetic field intensity at a center thereof and having cylindrical magnetic equal intensity surfaces about the center, said equal intensity surfaces extending substantially to a full extent of a magnitude of said target being measured, a variation of magnetic field intensity of said line-shaped specifying magnetic field on a cross-sectional plane thereof being slow in proximity of the center thereof and increasing rapidly with distance from the center;

said second specifying magnetic field $\Delta H_s'$ having a non-linear variation of magnetic field intensity, including a zero-gradient portion and a steep gradient portion along a longitudinal direction of a line-shaped portion of the target being measured where the local nuclear magnetization is excited by said line-shaped specifying magnetic field; and local information at a point in said line-shaped portion of the target is extracted by detecting those frequency components from said nuclear magnetic resonance signals which correspond to those substantially at said zero-gradient portion.

19. A method of measuring internal information from inside of a target, comprising the steps of:

applying a static magnetic field H to the target in one direction;

applying a high-frequency pulse-like magnetic field $H_1$ at right angles to said static magnetic field H, so as to maximize a transverse component of nuclear magnetization within the target;

selectively exciting local nuclear magnetization in the target by applying a first specifying magnetic field $\Delta H_s$ to said target in synchronism with said high-frequency pulse-like magnetic field $H_1$, said first specifying magnetic field having a non-linear magnetic gradient;

detecting nuclear magnetic resonance signals generated by said local nuclear magnetization thus excited, by applying a second specifying magnetic field $\Delta H_s'$ to the target; and extracting internal information of the target from the nuclear magnetic resonance signals thus detected;

said first specifying magnetic field $\Delta H_s$ for selectively exciting local nuclear magnetization comprising a planar specifying magnetic field having such a non-linear gradient of magnetic field intensity that planar equal intensity surfaces are provided with a minimum magnetic field intensity on a certain plane where magnetic field gradient is zero, while the magnetic field intensity increases rapidly with distance from said certain plane, so that the first specifying magnetic field excites nuclear magnetization in slice-like portions of the target being measured where the magnetic field gradient is zero; and said second specifying magnetic field $\Delta H_s'$ comprising a line-shaped specifying magnetic field having a minimum magnetic field intensity at a center thereof and having cylindrical magnetic equal intensity surfaces about the center, said equal intensity surfaces extending substantially to a full extent of a magnitude of said target being measured, a variation of magnetic field intensity of said line-shaped specifying magnetic field on a cross-sectional plane thereof being slow in proximity of the center thereof and increasing rapidly with distance from the center.

20. A method of measuring internal information from inside of a target, comprising the steps of:

applying a static magnetic field H to the target in one direction;

applying a high-frequency pulse-like magnetic field $H_1$ at right angles to said static magnetic field H, so as to maximize a transverse component of nuclear magnetization within the target;

selectively exciting local nuclear magnetization in the target by applying a first specifying magnetic field $\Delta H_s$ to said target in synchronism with said high-frequency pulse-like magnetic field $H_1$, said first specifying magnetic field having a non-linear magnetic gradient;

detecting nuclear magnetic resonance signals generated by said local nuclear magnetization thus excited, by applying a second specifying magnetic field $\Delta H_s'$ to the target; and extracting internal information of the target from the nuclear magnetic resonance signals thus detected;

said first specifying magnetic field $\Delta H_s$ for selectively exciting local nuclear magnetization comprising a line-shaped specifying magnetic field having a minimum magnetic field intensity at a center thereof and cylindrical magnetic equal intensity surfaces about the center, said equal intensity surfaces extending substantially to a full extent of a magnitude of said target being measured, a variation of magnetic field intensity of said line-shaped specifying magnetic field on a cross-sectional plane thereof being slow in proximity of the center thereof and increasing rapidly with distance from the center;

said second specifying magnetic field $\Delta H_s'$ comprising a step-like specifying magnetic field having a step-like variation of magnetic field intensity, including a zero-gradient portion and a steep gradient portion located alternately along a longitudinal direction of a line-shaped portion of the target being measured where the local nuclear magnetization is excited by said line-shaped specifying magnetic field; and local information at diversified points corresponding to different steps of the step-like variation of magnetic field intensity in said line-shaped portion of the target being simultaneously extracted from said nuclear magnetic resonance signals by detecting those frequency components which correspond to those of flat portions of said steps.

21. A method of measuring internal information from inside of a target, comprising the steps of:

applying a static magnetic field H to the target in one direction;

applying a high-frequency pulse-like magnetic field $H_1$ at right angles to said static magnetic field H, so as to maximize a transverse component of nuclear magnetization within the target;

selectively exciting local nuclear magnetization in the target by applying a first specifying magnetic field $\Delta H_s$ to said target in synchronism with said high-frequency pulse-like magnetic field $H_1$, said first specifying magnetic field having a non-linear magnetic gradient;

detecting nuclear magnetic resonance signals generated by said local nuclear magnetization thus excited, by applying a second specifying magnetic field $\Delta H_s'$ to the target; and extracting internal information of the target from the nuclear magnetic resonance signals thus detected;

said first specifying magnetic field $\Delta H_s$ for selectively exciting local nuclear magnetization comprising a number of parallel line-shaped magnetic fields, each of which includes closed cylindrical magnetic equal intensity surfaces, so that nuclear magnetizations at a number of parallel line-shaped portions of the target under said line-shaped magnetic field can be simultaneously excited;

said second specifying magnetic field $\Delta H_s'$ comprising a magnetic field having such a varying intensity of magnetic field and intersecting said parallel line-shaped portions of the target with such an angle that all points in the thus intersected parts of said parallel line-shaped portions with excited nuclear magnetization are in different Larmor frequency regions; and local information at a number of intersections being simultaneously extracted from said nuclear magnetic resonance signals.

22. A method as set forth in claim 21, wherein said second specifying magnetic field $\Delta H_s'$ is a magnetic field having a linearly varying intensity of magnetic field.

23. A method as set forth in claim 21, wherein said second specifying magnetic field $\Delta H_s'$ is a magnetic field whose intensity of magnetic field varies in steps.

* * * * *